(12) United States Patent
Gouda et al.

(10) Patent No.: US 7,592,263 B2
(45) Date of Patent: Sep. 22, 2009

(54) METHOD OF MANUFACTURING SEMICONDUCTOR DEVICE

(75) Inventors: Kazuo Gouda, Osaka (JP); Koji Tsuji, Suita (JP); Masao Kirihara, Kadoma (JP); Youichi Nishijima, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 425 days.

(21) Appl. No.: 10/598,372

(22) PCT Filed: Mar. 15, 2005

(86) PCT No.: PCT/JP2005/005039

§ 371 (c)(1), (2), (4) Date: Feb. 5, 2007

(87) PCT Pub. No.: WO2005/087652

PCT Pub. Date: Sep. 22, 2005

(65) Prior Publication Data

US 2008/0038921 A1 Feb. 14, 2008

(30) Foreign Application Priority Data

Mar. 15, 2004 (JP) ............................. 2004-073218

(51) Int. Cl.
*H01L 21/302* (2006.01)
(52) U.S. Cl. .................. 438/719; 438/620; 438/700
(58) Field of Classification Search .................. 438/700, 438/702, 719, 723, 724, 620, 622
See application file for complete search history.

(56) References Cited

U.S. PATENT DOCUMENTS 5,354,421 A 10/1994 Tatsumi et al.

6,090,699 A * 7/2000 Aoyama et al. ............. 438/622

(Continued)

FOREIGN PATENT DOCUMENTS

EP 0428175 5/1991

(Continued)

OTHER PUBLICATIONS

English Language Abstract of JP 2000-187041.

(Continued)

*Primary Examiner*—Kin-Chan Chen
(74) *Attorney, Agent, or Firm*—Greenblum & Bernstein, P.L.C.

(57) ABSTRACT

A method of manufacturing a semiconductor device. In this method, a concave portion is formed in one surface in the thickness direction of a primary base plate comprising a semiconductor substrate with a relatively large thickness dimension. Then, through-holes are formed by a reactive-ion etching process using as a mask an opening formed in an oxide film provided on the other surface in the thickness direction of the primary base plate. The opening has a narrow width in a region corresponding to the concave portion and a wide width in the remaining region. Thus, respective times necessary for the wide-width through-hole to penetrate through the primary base plate and necessary for the narrow-width through-hole to reach a bottom surface of the concave portion can be approximately equalized to complete the common etching process of the wide-width through-hole and the narrow-width through-hole approximately simultaneously.

6 Claims, 6 Drawing Sheets

U.S. PATENT DOCUMENTS

| | | | |
|---|---|---|---|
| 6,323,117 B1 * | 11/2001 | Noguchi | 438/620 |
| 6,350,952 B1 * | 2/2002 | Gaku et al. | 174/522 |
| 6,528,724 B1 | 3/2003 | Yoshida et al. | |
| 2001/0045667 A1 * | 11/2001 | Yamauchi et al. | 257/774 |
| 2002/0180027 A1 * | 12/2002 | Yamaguchi et al. | 257/700 |
| 2003/0176071 A1 | 9/2003 | Oohara et al. | |
| 2004/0137661 A1 * | 7/2004 | Murayama | 438/106 |
| 2005/0093668 A1 * | 5/2005 | Bueyuektas et al. | 336/200 |
| 2005/0263869 A1 * | 12/2005 | Tanaka et al. | 257/686 |

FOREIGN PATENT DOCUMENTS

| | | |
|---|---|---|
| EP | 1203748 | 5/2002 |
| JP | 2000-187041 | 7/2000 |
| JP | 2002-198327 | 7/2002 |
| JP | 2003-273370 | 9/2003 |
| KR | 100238691 | 1/2000 |
| WO | 01/53194 | 7/2001 |

OTHER PUBLICATIONS

English Language Abstract of JP 2003-273370.
English Language Abstract of JP 2002-198327.
Bhave et al, "*An Integrated, Vertical-Drive, In-Plane-Sensemicrogyroscope*" Transducers '3 (IEEE, The 12$^{th}$ International Conference on Solid-State Sensors, Actuators Microsystems), Boston U.S., Jun. 8-12, 2003, pp. 171-174.

* cited by examiner

METHOD OF MANUFACTURING SEMICONDUCTOR DEVICE

TECHNICAL FIELD

The present invention relates to a method of manufacturing a semiconductor device, which is suitable for use in manufacturing a micromachine, such as MEMS (Micro Electro Mechanical System).

BACKGROUND ART

In late years, it has been proposed to construct an acceleration sensor or an angular velocity sensor as a micromachine using semiconductor manufacturing technologies. This type of micromachine requires a mass body having a relatively large inertial mass. As a method of forming such a mass body, it is conceivable to form a through-hole (including a slit-shaped through-hole) in a semiconductor substrate having a relatively large thickness dimension (several hundred μm) so as to separate a mass body from the remaining region. The through-hole is formed in a semiconductor substrate with a relatively large thickness dimension by means of an etching technique, such as a wet etching process or a reactive-ion etching process. This technique is disclosed, for example, in Sunil A. Bhave et al. "AN INTEGRATED VERTICAL-DRIVE, IN-PLANE-SENSE MICROGYROSCOPE", TRANSDUCERS '03 (IEEE, The 12th International Conference on Solid-State Sensor, Actuators and Microsystems), USA, Jun. 8-12, 2003, p. 171.

It is known that, in the process for forming a through-hole in a semiconductor substrate using the above technique, the speed or rate of removing a semiconductor material is dependent on the width of an opening provided in a mask. That is, a region of the semiconductor substrate corresponding to the relatively wide opening width has a larger removal rate in the depth direction as compared to a region corresponding to the relatively narrow opening width. Thus, in a process of forming two types of through-holes different in width dimension in a common semiconductor substrate, it is likely that, at the time when one through-hole having a larger width dimension penetrates through the semiconductor substrate, the other through-hole having a smaller width dimension has not yet penetrated through the semiconductor substrate. If the difference in the opening width is small, the difference, between respective times necessary for the wide-width through-hole to penetrate through the semiconductor substrate and necessary for the narrow-width through-hole to penetrate through the semiconductor substrate will fall within an allowable error or tolerance. However, if the difference in the opening width is large, it must be required to wait for a relatively long time until the narrow-width through-hole penetrates through the semiconductor substrate after the wide-width through-hole penetrates through the semiconductor substrate. This causes the problem that the inner peripheral surface of the wide-width through-hole is eaten away or corroded during the waiting time, resulting in deteriorated dimensional accuracy of the wide-width through-hole.

If it is attempted to avoid this kind of problem by use of conventional techniques, the process of forming two types of through-holes different in width dimension has to be divided into two separate processes. This causes the increase in process time for forming the through-holes, and in the number of processes due to the need for protecting one through-hole formed in a preceding process by a protective material, and removing the protective material. Consequently, the process time will be considerably increased.

DISCLOSURE OF INVENTION

In view of the above circumstances, it is therefore an object of the present invention to provide a semiconductor-device manufacturing method capable of forming plural types of through-holes different in width dimension, in a common semiconductor substrate, without substantial increase in process time.

Specifically, the present invention provides a method of manufacturing a semiconductor device, by use of a perforating process including providing a mask having an opening on a semiconductor substrate, and forming plural types of through-holes different in width dimension in the semiconductor substrate, wherein a removal rate of a semiconductor material in the depth direction of the semiconductor substrate becomes higher as the opening has a wider opening width. This method comprises: a first step of forming a concave portion in a first surface of a semiconductor substrate, in a first region of the semiconductor substrate corresponding to the opening of the mask having a relatively narrow opening width, to allow the first region to have a thickness dimension less than that of a second, remaining, region of the semiconductor substrate; and a second step of performing the perforating process using the mask provided on a second, opposite, surface of the semiconductor substrate, to form a first through-hole reaching the first surface in the second region of the semiconductor substrate and a second through-hole reaching the concave portion.

According to the above method, the thickness dimension of the semiconductor substrate is changed in proportion to the respective width dimensions of the through-holes to approximately equalize the respective penetration times of the through-holes. This makes it possible to form plural types of through-holes different in width dimension, through a single or simultaneous perforating process, and thereby form the through-holes with a high-degree of accuracy without substantial increase in process time.

Preferably, the above semiconductor-device manufacturing method includes joining the first surface of the semiconductor substrate to a support substrate after the first step, and then performing the second step.

In this case, a concave portion is formed in the semiconductor substrate to be formed with the through-holes, so as to provide a plurality of regions different in thickness dimension to the semiconductor substrate, and then the semiconductor substrate is joined to the support substrate. Subsequently, the through-holes are formed in the semiconductor substrate. Thus, even if the regions of the semiconductor substrate are separated from each other by the through-holes, the regions to be separated can be joined to the support substrate in advance to prevent the relative displacement between the regions after the separation.

The present invention provides another method of manufacturing a semiconductor device, by use of a perforating process including providing a mask having an opening on a semiconductor substrate, and forming plural types of through-holes different in width dimension in the semiconductor substrate, wherein a removal rate of a semiconductor material in the depth direction of the semiconductor substrate becomes higher as the opening has a wider opening width. This method comprises: a first step of performing the perforating process using the mask provided on a first surface of a semiconductor substrate until a first through-hole having a relatively wide width dimension reaches a second, opposite, surface of the semiconductor substrate; and a second step of forming a concave portion in the second surface of the semiconductor substrate, in a region of the semiconductor substrate corresponding to the opening of the mask having a relatively narrow opening width, to allow a second through-hole having a relatively narrow width dimension to penetrate to a bottom surface of the concave portion.

According to the above method, the process of forming the through-holes is completed even if the second through-hole having a relatively narrow width dimension has not yet penetrated through the semiconductor substrate, and then a concave portion is formed in the second surface on the opposite side on the first surface to allow the penetration of the second through-hole having a relatively narrow width dimension. This makes it possible to form the through-holes different in width dimension, through a single or simultaneous perforating process, and thereby form the through-holes with a high-degree of accuracy without substantial increase in process time.

According to the semiconductor-device manufacturing method of the present invention, plural types of through-holes different in width dimension can be formed through a single perforating process, and only the process for forming the concave portion is added to the perforating process for forming the through-holes. Thus, the through-holes can be accurately formed without substantial increase in process time.

BRIEF DESCRIPTION OF DRAWINGS

A better understanding of the present invention can be obtained when the following detailed description of the preferred embodiment is considered in conjunction with the accompanying drawings. In the accompanying drawings, a common component or element is defined by the same reference numeral or code.

BEST MODE FOR CARRYING OUT THE INVENTION

This application is based upon and claims the benefit of priority from the prior Japanese Patent Application No. 2004-73218 filed in Japan; the entire contents of which are incorporated herein by reference. With reference to the accompanying drawings, an embodiment of the present invention will now be specifically described. Some embodiments of the present invention will now be specifically described.

First Embodiment

Figure 1A:
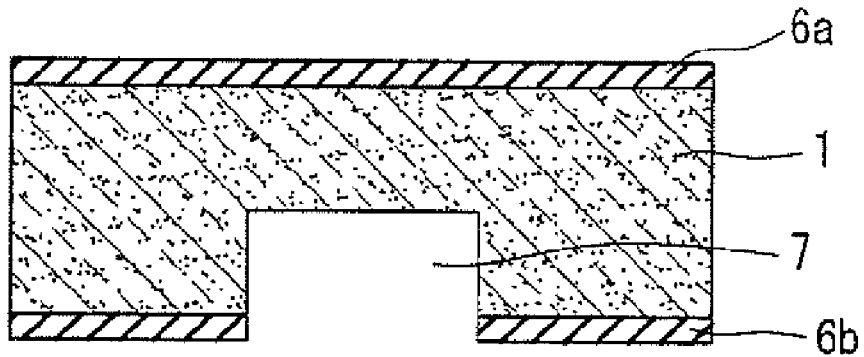
FIGS. 1A to 1C are process diagrams showing a method according to a first embodiment of the present invention.
Figure 1B:
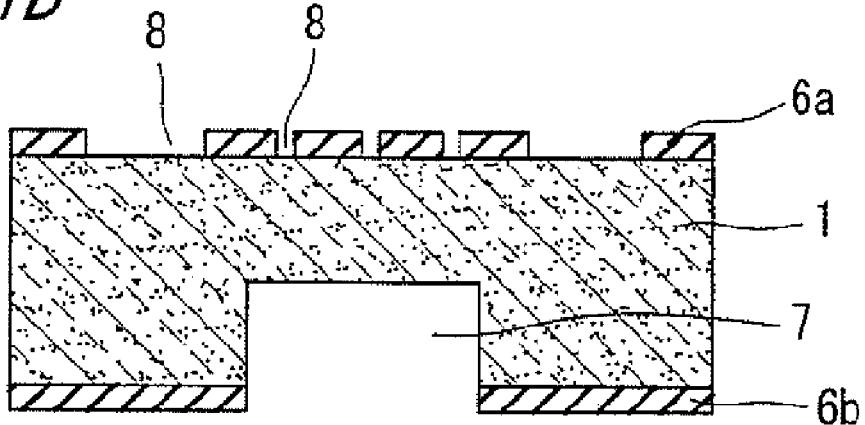
Figure 1C:
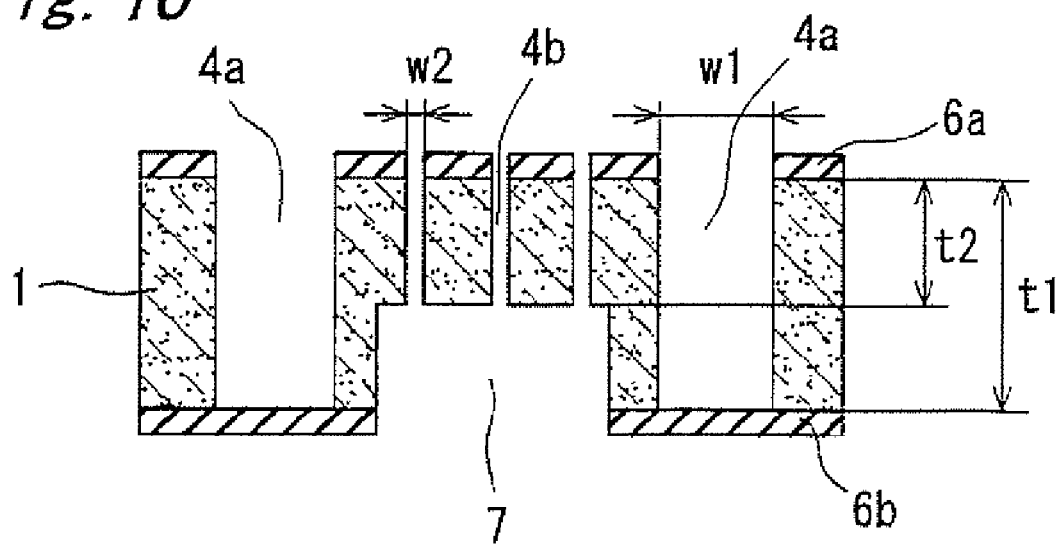

A method according to a first embodiment of the present invention is intended to form a first through-hole 4a having a relatively wide width dimension and a second through-hole 4b having a relatively narrow width dimension, in a primary base plate 1 comprising a semiconductor substrate, as shown in FIG. 1C. While the primary base plate 1 is contemplated to be formed using a silicon substrate, the technical idea of the present invention may be applied to a base plate formed using any other suitable semiconductor substrate. The base plate 1 has first and second regions each formed to have a different thickness dimension. In FIG. 1C, a larger thickness dimension t1 is set, for example, at about 300 µm, and a small thickness dimension t2 is set, for example, at about 150 µm. The first through-hole 4a is set to have a width dimension w1 of about 100 µm, and the second through-hole 4b is set to have a width dimension w2 of about 5 µm.

Typically, when through-holes 4a, 4b are formed in a semiconductor substrate having a relatively large thickness dimension as described above, a mask having openings corresponding to the through-holes 4a, 4b is provided on a surface of the semiconductor substrate, and a semiconductor material in regions to be formed with the through-holes 4a, 4b is removed by a reactive-ion etching process. In the reactive-ion etching process, it is known that a region of a semiconductor substrate having a wide width dimension has a higher rate of removing the semiconductor material in the depth direction of the semiconductor substrate, or a higher depth-directional removal rate, than that in a region of the semiconductor substrate having a narrow width dimension. Thus, if it is attempted to form through-holes 4a, 4b different in width dimension, in a region of a semiconductor substrate having the same thickness dimension, it is likely that, at the time when the wide-width through-hole 4a penetrates through the semiconductor substrate, the narrow-width through-hole 4b has not yet penetrated through the semiconductor substrate. Particularly, in a process for forming the through-holes 4a, 4b whose width dimensions w1, w2 have a large difference as described above, if a waiting time is provided until the narrow-width through-hole 4b penetrates through the semiconductor substrate, it is likely that the inner peripheral surface of the wide-width through-hole 4a will also be corroded to cause deteriorated accuracy in the width dimension of the through-hole 4a.

With this point in view, as shown in FIG. 1A, in the first embodiment, after forming an oxide film on each of the first and second surfaces of the primary base plate 1, a concave portion 7 is formed in the first surface of the primary base plate 1 in a first region of the primary base plate 1 to be formed with the narrow-width through-hole 4a, using the oxide film 6b on the first surface, or the lower side surface in FIG. 1A, as a mask. That is, the concave portion 7 is formed in the primary base plate 1 to allow the first region to be formed with the narrow-width through-hole 4a to have a thickness dimension t2 less than a second, remaining, region of the primary base plate 1 (1st Step). Then, as shown in FIG. 1B, openings corresponding to the through-holes 4a, 4b are formed in the oxide film on a second, opposite, surface, or the upper surface in FIG. 1B. Then, the second surface is subjected to a reactive-ion etching process using the oxide film 6a as a mask. Through this process, the through-holes 4a, 4b illustrated in FIG. 1C are formed (2nd Step).

As described above, the concave portion 7 is formed in the first surface of the primary base plate 1 to provide the two first and second regions different in thickness dimension to the primary base plate, and then the through-holes 4a, 4b are formed from the side of the second surface of the primary base plate 1 using the mask provided on the second surface of the primary base plate 1. Thus, the narrow-width through-hole 4b can reach a bottom surface of the concave portion 7 at the time when the wide-width through-hole 4a penetrates through the second region of the primary base plate 1. This allows the wide-width through-hole 4a and the narrow-width through-hole 4b to penetrate approximately simultaneously.

In this way, the primary base plate 1 can be accurately formed without deterioration in accuracy of the width dimension of the wide-width through-hole 4a due to corrosion of the inner surface of through-hole 4a.

Figure 2:
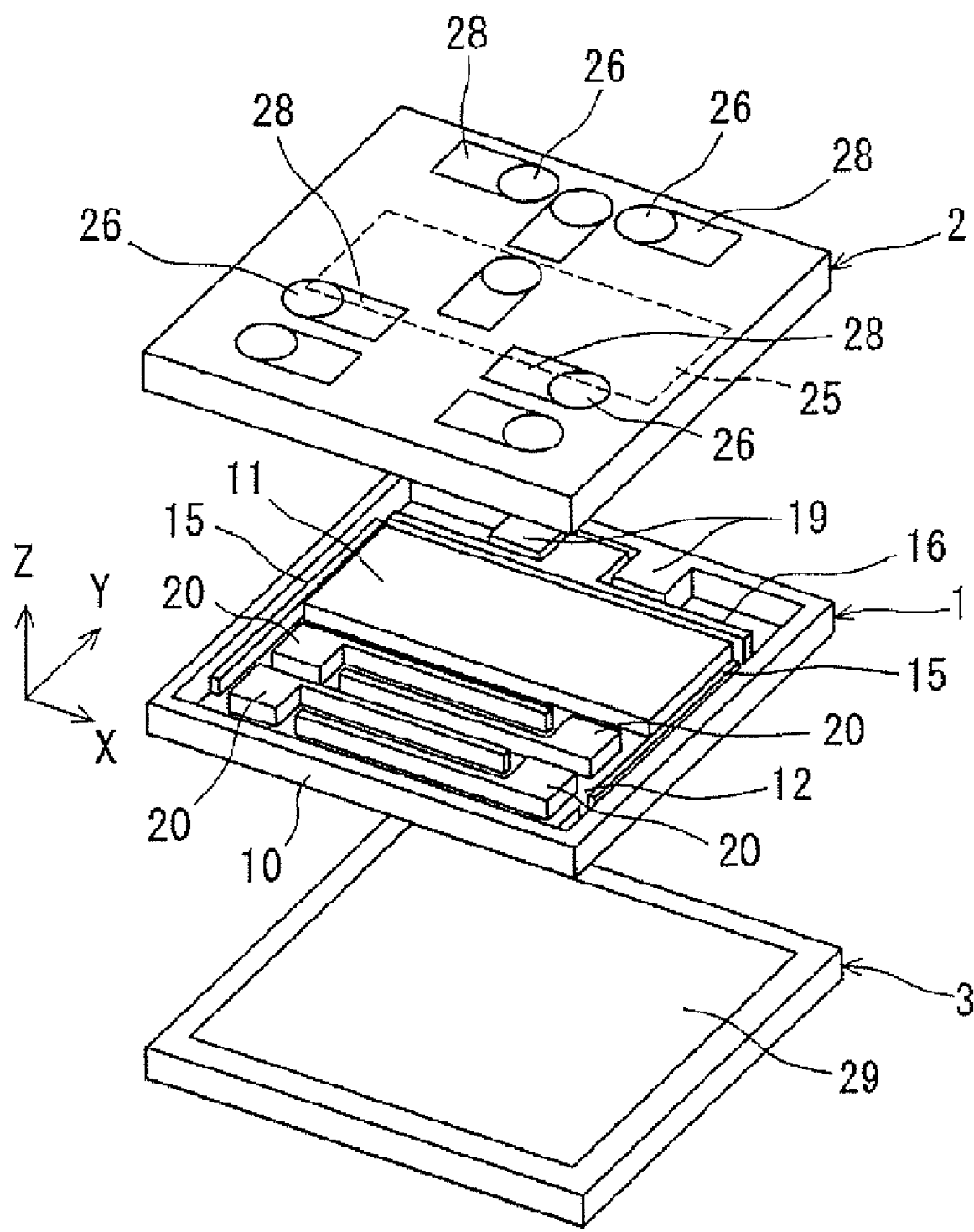
FIG. 2 is an explored perspective view of a gyro sensor to be formed by the process in FIG. 1.
Figure 3:
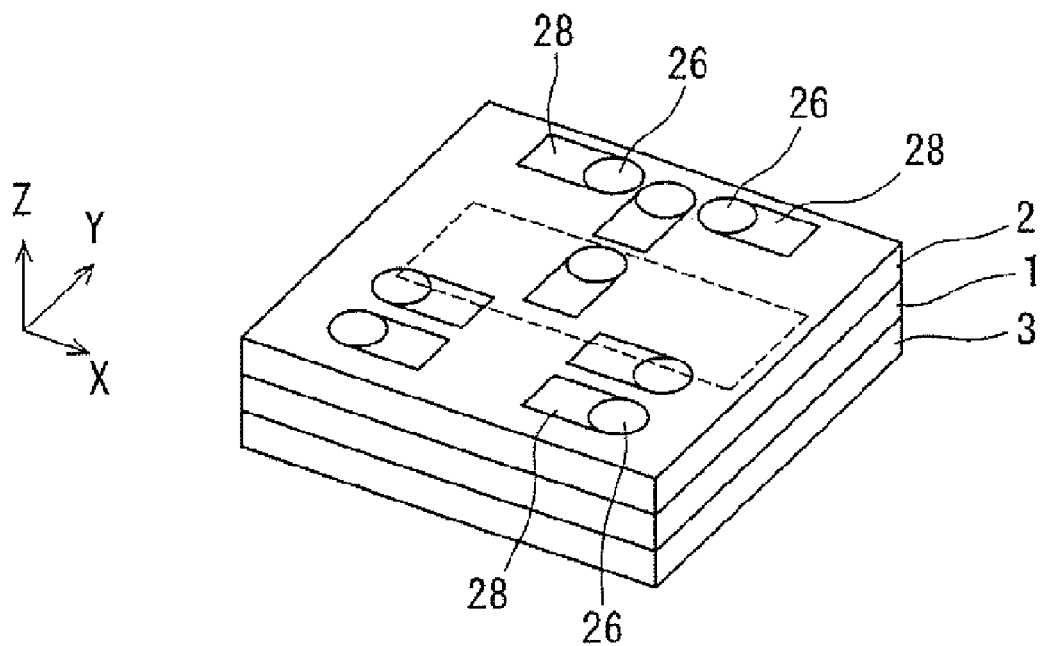
FIG. 3 is a perspective view of a gyro sensor to be formed by the process in FIG. 1.

The above technique may be applied to the manufacturing of a gyro sensor as shown in FIGS. 2 and 3. The illustrated gyro sensor has a three-layer structure formed by superimposing a support base plate 2 comprising a glass substrate on one surface of a primary base plate 1 comprising a semiconductor substrate, and superimposing a cap 3 comprising a glass substrate on the other surface of the primary base plate 1. In this structure, each of the support base plate 2 and the cap 3 is joined to the primary base plate 1, for example, by an anodic bonding process.

Figure 4:
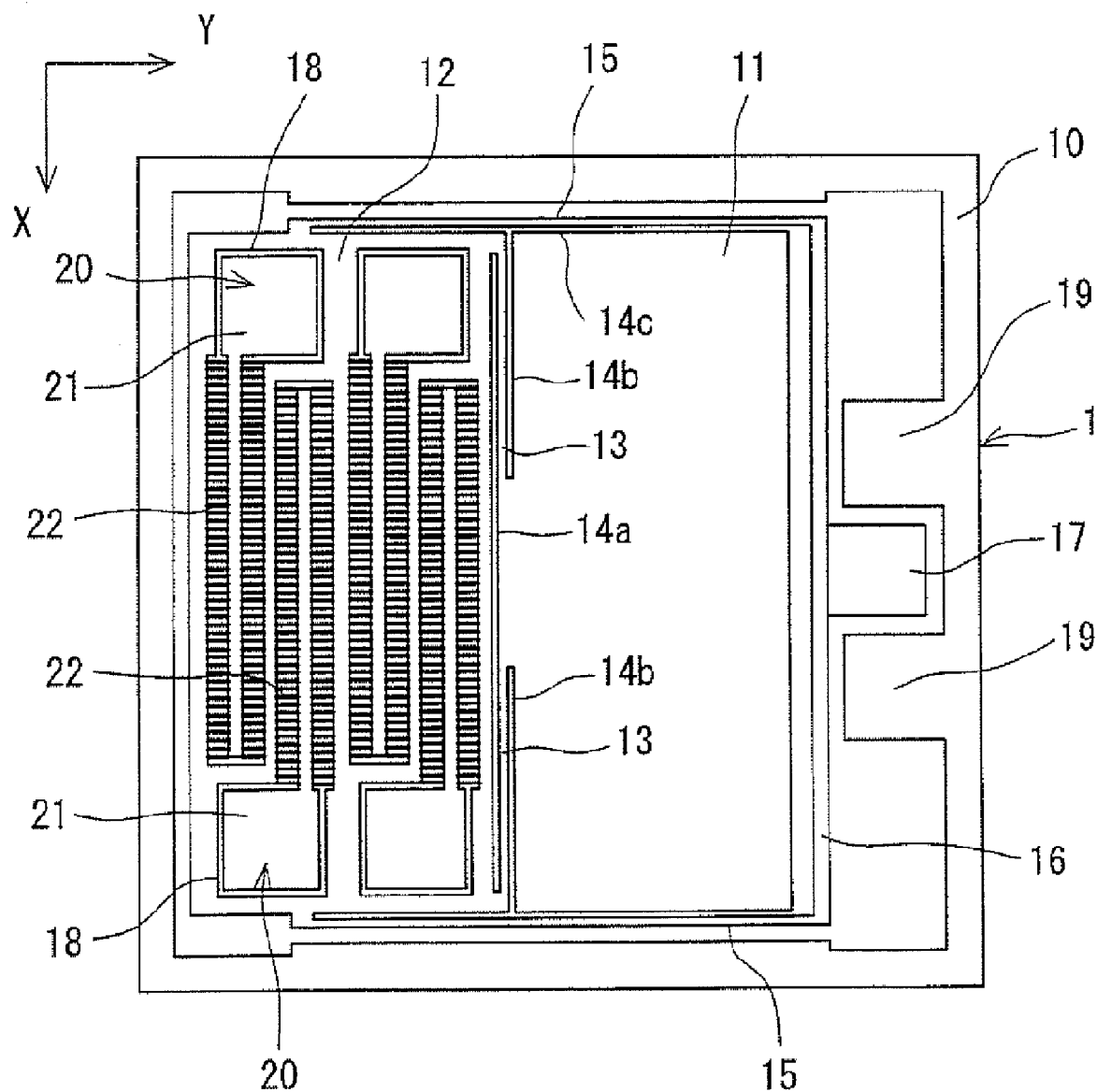
FIG. 4 is a top plan view showing a primary base plate of a gyro sensor to be formed by the process in FIG. 1.

As shown in FIG. 4, the primary base plate 1 includes a driven mass body 11 and a detection mass body 12 which are formed in a rectangular shape in top plan view and disposed in parallel to one another along a plate surface of the primary base plate 1. The primary base plate 1 further includes a rectangular-shaped frame 10 surrounding around the driven mass body 11 and the detection mass body 12. Thus, in the state after the support base plate 2 and the cap 3 are joined to the primary base plate 1, the driven mass body 11 and the detection mass body 12 are hermetically contained in a space surrounded by the support base plate 2, the cap 3 and the frame 10. In the following description, a direction along which the driven mass body 11 and the detection mass body 12 are aligned is defined as a Y-direction, and a direction orthogonal to the Y-direction in a plane along the plate surface of the primary base plate 1 is defined as an X-direction. Further, a direction orthogonal to both the X-direction and the Y-direction or to the plate surface of the primary base plate 1 is defined as a Z-direction.

The driven mass body 11 and the detection mass body 12 are connected to one another continuously and integrally through a pair of drive springs 13 each extending in the X-direction. More specifically, the primary base plate 1 is formed with a slit groove 14a having a length slightly less than the entire length of the detection mass body 12 in the X-direction, and two slit grooves 14b aligned on a straight line extending in the X-direction, in such a manner that one end, or first end, of each slit grooves 14b is opened to a corresponding one of X-directionally opposed edges of the driven mass body 11. Each of the drive springs 13 is formed between the slit groove 14a and each of the slit grooves 14b. One end, or first end, of each of the drive springs 13 is connected to a region between one of opposite ends of the slit groove 14a and a corresponding edge of the detection mass body 12, and the other end, or second end, of each of the drive springs 13 is connected to the driven mass body 11 through a region between respective second ends of the two slit grooves 14b. Each of the drive springs 13 is formed as a torsionally deformable torsion spring, and thereby the driven mass body 11 is displaceable relative to the detection mass body 12 around the drive springs 13. In other words, the driven mass body 11 is designed to be translationally movable in the Z-direction and rotatable around an X-directional axis, relative to the detection mass body 12.

Each of a pair of detection springs 15 extending in the Y-direction has one end, or first end, connected to a corresponding one of X-directionally opposed edges of the detection mass body 12, and respective second ends of the detection springs 15 are connected to one another continuously and integrally through a coupling segment 16 extending in the X-direction. That is, a member having a reverse C shape in top plan view is formed by the pair of detection springs 15 and the coupling segment 16. The coupling segment 16 is designed to have a sufficiently higher rigidity than those of the drive springs 13 and detection springs 15. A fixing segment 17 is provided in a protruding manner in a longitudinally intermediate portion of the coupling segment 16A. The fixing segment 17 is joined to the support base plate 2, and fixed at a given position. The driven mass body 11 and the detection mass body 12 are separated from the detection springs 15 and the coupling segment 16 by a reverse C-shaped slit groove 14c, and the respective first ends of the slit grooves 14b are connected to the slit groove 14c. Each of the detection springs 15 is bendably deformed in the X-direction to allow the driven mass body 11 and the detection mass body 12 to be displaced relative to the fixing segment 17 in the X-direction.

Figure 5:
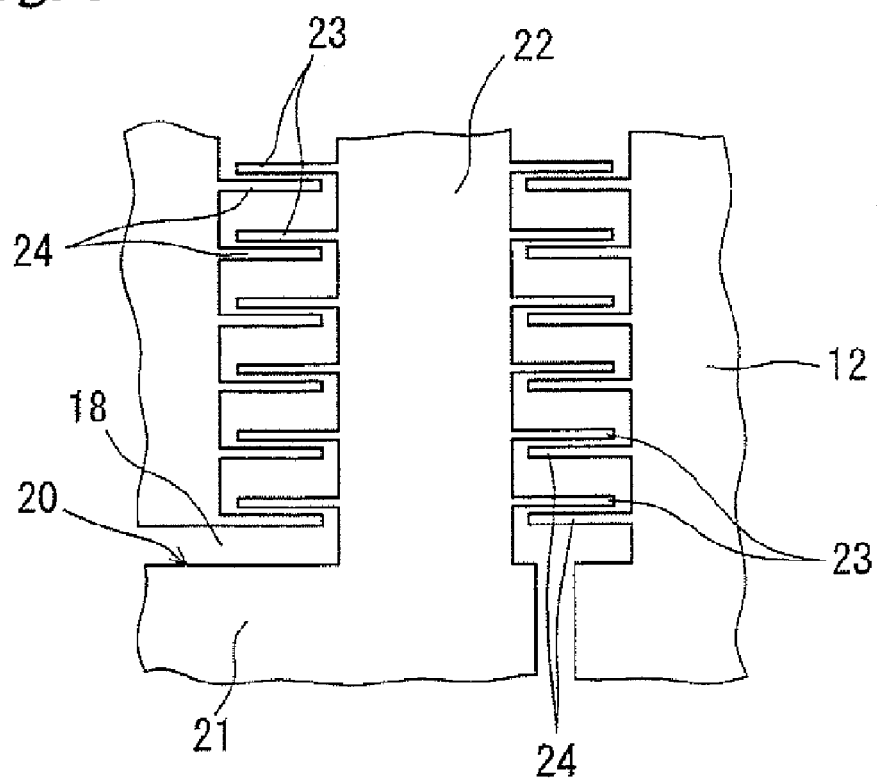
FIG. 5 is a fragmentary top plan view showing a primary base plate of a gyro sensor to be formed by the process in FIG. 1.

The detection mass body 12 has four cutoff holes 18 penetrating therethrough in its thickness direction, and four stationary members 20 are disposed, respectively, within the cutout holes 18. Each of the stationary members 20 has an electrode segment 21 disposed in the vicinity of one of the X-directionally opposed ends of the detection mass body 12, and a comb-skeleton segment 22 extending from the electrode segment 21 in the X-direction. The electrode segment 21 and the comb-skeleton segment 22 have an L shape in their entirety. The electrode segment 21 and the comb-skeleton segment 22 are joined to the support base plate 2 to fix the stationary member 20 at a given position. The cutout hole 18 has an inner peripheral surface along the shape of the outer peripheral surface of the stationary member 20, and a certain space or gap is formed between the stationary member 20 and the inner peripheral surface of the cutout hole 18. Two of the electrode segments 21 are disposed at each of the X-directionally opposed ends of the detection mass body 12. A number of stationary comb-tooth segments 23 are provided on each of width-directionally opposed edges of the comb-skeleton segments 22 and disposed parallel to each other in the X-direction. Further, a number of movable comb-tooth segments 24 are provided on an inner surface of the cutout hole 18 opposed to the comb-skeleton segment 22 and disposed parallel to each other in the X-direction and in opposed relation to the corresponding stationary comb-tooth segments 23, as shown in FIG. 5. The stationary comb-tooth segments 23 and the corresponding movable comb-tooth segments 24 are designed such that they are spaced apart from each other, and the change in electrostatic capacitance caused by the change in distance between the stationary comb-tooth segments 23 and the corresponding movable comb-tooth segments 24 in response to the displacement of the detection mass body 12 in the X-direction is detected.

A stationary driving electrode 25 (see FIG. 2) consisting of a thin film made of conductive metal, such as aluminum, is formed on a surface region of the support base plate 2 opposed to the driven mass body 11. Further, a through-hole 26 is formed in each of regions of the support base plate 2 corresponding to the fixing segment 17, the electrode segments 21 of the stationary members 20, and the stationary driving electrode 25. In the illustrated example, a pair of ground segments 19 is formed in a region of the frame 10 adjacent to the fixing segment 17 in such a manner as to sandwich the fixing segment 17 therebetween, and an additional through-hole 26 is formed in a region of the support base plate 2 corresponding to each of the ground segments 19. An electrode wiring (not shown) consisting of a thin film made of conductive metal, such as aluminum, similar to that to be obtained by a through-hole plating process is formed on the inner peripheral surface of each of the through-hole 26. Each of the through-hole 26 has a tapered shape having an inner diameter which becomes smaller at a position closer to the primary base plate 1. The electrode wiring is formed to cover a surface of the primary base plate 1 in addition to each inner peripheral surface of the through-holes 26. Specifically, one open end of each of the through-holes 26 is closed by the electrode wiring in such a manner that the electrode wiring is electrically connected to each component of the primary base plate 1. A part of the electrode wiring extends to a front surface (a surface on the opposite side of the primary base plate 1 in its thickness direction) of the support base plate 2. The part of the electrode wiring extending to the front surface of the support base plate 2 serves as an electrode pad 28.

An operation of the above gyro sensor will be described below. As mentioned in connection with the conventional gyro sensor, this gyro sensor is also operable to detect the displacement of the detection mass body 12 when an angular velocity due to an external force acts thereon under the condition that the driven mass body 11 is being vibrated in given parameters. A sinusoidal or rectangular-wave vibration voltage may be applied between the stationary driving electrode 25 and the driven mass body 11 to vibrate the driven mass body 11. While it is preferable to use an AC voltage, it is not essential to invert polarity. The driven mass body 11 is electrically connected to the fixing segment 17 through the drive springs 13, the detection mass body 12, the detection springs 15 and the coupling segment 16. The support base plate 2 is formed with the through-holes 26 in the regions thereof corresponding to the fixing segment 17 and the stationary driving electrode 25. Thus, a vibration voltage can be applied to the electrode pads 28 corresponding to the two through-holes 26, to generate an electrostatic force between the driven mass body 11 and the stationary driving electrode 25 so as to vibrate the driven mass body 11 relative to the support base plate 2 and the cap 3 in the Z-direction. The vibration voltage may be adjusted to have a frequency identical to a resonance frequency determined by the masses of the driven mass body 11 and the detection mass body 12, and the spring constants of the drive springs 13 and the detection springs 15, so as to allow a large vibrational amplitude to be obtained by a relatively small driving force.

When an angular velocity around the Y-directional axis acts on the primary base plate 1 under the condition that the driven mass body 11 is being vibrated, a Coriolis force is generated in the X-direction, and thereby the detection mass body 12 (and the driven mass body 11) is displaced relative to the stationary members 20 in the X-direction. Thus, the movable comb-tooth segments 24 are displaced relative to the stationary comb-tooth segments 23, and thereby the distance between the movable comb-tooth segments 24 and the stationary comb-tooth segments 23 is changed. Accordingly, the electrostatic capacitance between the movable comb-tooth segments 24 and the stationary comb-tooth segments 23 is changed. This change in electrostatic capacitance can be picked up from the electrode wirings connected to the four stationary members 20. Specifically, the electrostatic capacitance between each pair of electrode segments 21 aligned in the X-direction reflects the change in distance between the stationary comb-tooth segments 23 and the movable comb-tooth segments 24, and the pair of electrode segments 21 are equivalent to electrodes of a variable capacitor. That is, the illustrated structure includes two variable capacitors. Thus, the displacement of the detection mass body 12 can be determined by detecting each electrostatic capacitance of the variable capacitors or detecting the combined capacitance of the variable capacitors connected in parallel with one another. The vibration parameters of the driven mass body 11 are known, and thereby the Coriolis force can be determined by detecting the displacement of the detection mass body 12.

The displacement of the movable comb-tooth segments 24 is proportional to (the mass of the driven mass body 11)/(the mass of the driven mass body 11+the mass of the detection mass body 12). Thus, when the mass of the driven mass body 11 has a larger value as compared to the mass of the detection mass body 12, the displacement of the movable comb-tooth segments 24 will be increased to provide enhanced sensitivity. In the first embodiment, the primary base plate 1 has the second region having a thickness dimension of about 300 µm, and the first region having a thickness dimension of about 150 µm. Thus, the driven mass body 11 and the detection mass body 12 may be formed in the second region having a large thickness dimension and the first region having a small thickness dimension, respectively.

More specifically, each space between the movable comb-tooth segments 24 formed in the detection mass body 12 and the stationary comb-tooth segments 23 is less than the space between the inner peripheral surface of the cutoff hole 18 formed in the detection mass body 12 and the outer peripheral surface of the stationary member 20. Thus, when the process illustrated in FIGS. 1A to 1C is applied to these regions, the detection mass body may be designed to have a small thickness dimension in a region to be formed with the narrower spaces between the movable comb-tooth segments 24 and the stationary comb-tooth segments 23. This technique can be employed to assure the dimensional accuracy between the movable comb-tooth segments 24 and the stationary comb-tooth segments 23 as well as the dimensional accuracy between the inner peripheral surface of the cutoff hole 18 and the stationary member 20, and reduce the thickness dimension of the detection mass body 12 so as to reduce the mass of the detection mass body 12 relative to the mass of the driven mass body 11 to achieve enhanced sensitivity.

Figure 6A:
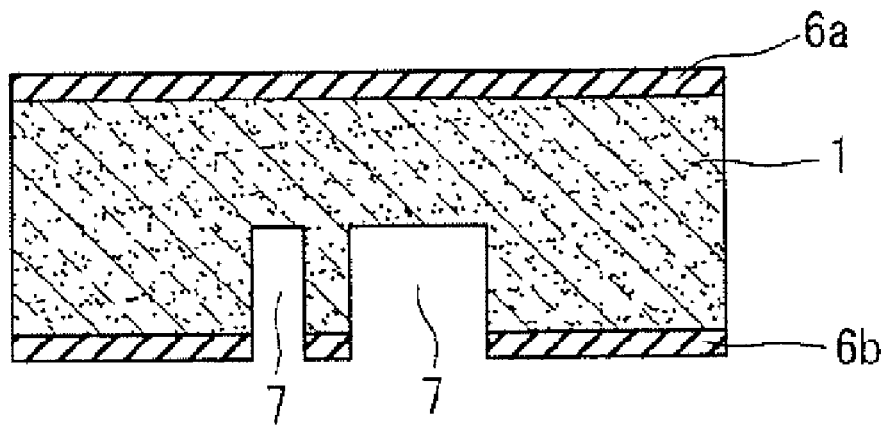
FIGS. 6A to 6C are diagram showing another example of the process according to the first embodiment.
Figure 6B:
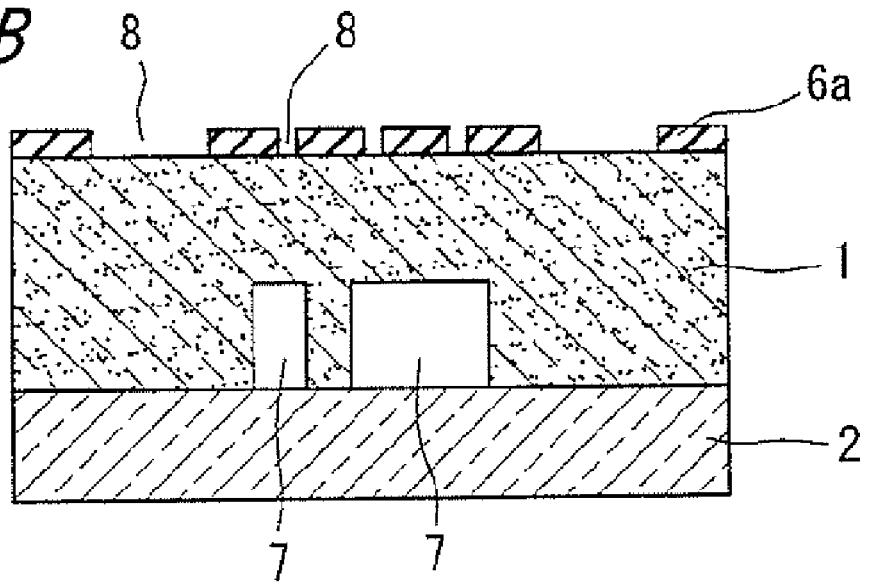
Figure 6C:
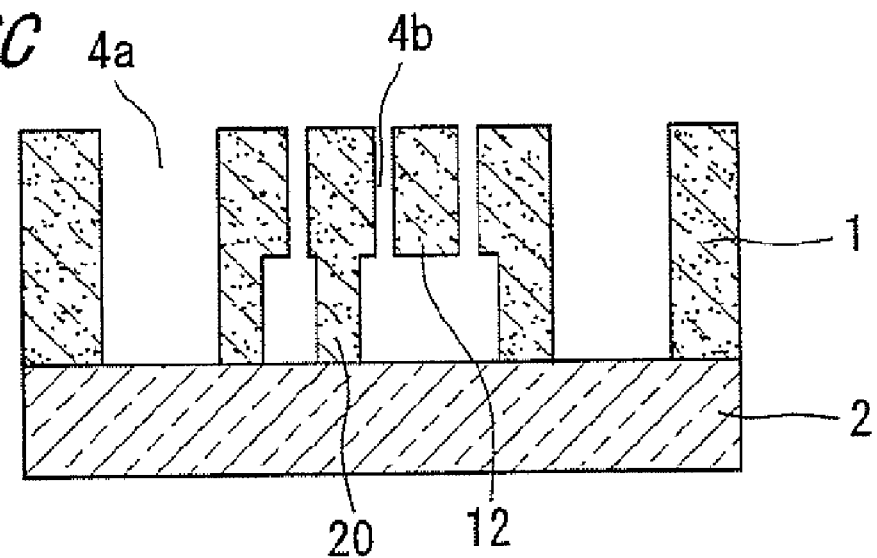

In a process of manufacturing the gyro sensor by employing the aforementioned technique, concave portions 7 are formed in the primary base plate, as shown in FIG. 6A, and then the first surface of the primary base plate 1 formed with the concave portion 7 is joined to the support base plate 2, as shown in FIG. 6B. Then, as shown in FIG. 6C, through-holes 4a, 4b are formed in the primary base plate 1. More specifically, the concave portions 7 is formed in the first surface of the primary base plate 1 opposed to the support base plate 2, and then the primary base plate 1 is joined to the support base plate 2 formed with the through-holes 26. It is to be understood that the oxide film 6b is removed before the primary base plate 1 is joined to the support base plate 2. In the state just after the primary base plate 1 is joined to the support base plate 2, the component (the frame 10, the driven mass body 11, the detection mass body 12, the stationary member 20) of the primary mass body 1 are not separated from each other. Thus, the groove for separating the frame 10, the slit grooves 14a to 14c and the grooves for separating the stationary members 20 are formed from the side of the second surface of the primary base plate 1 opposed to the cap 3 to separate the components from each other. That is, the through-holes 4a, 4b are formed in the primary base plate 1. In the state after the components of the primary base plate 1 are separated from each other, the fixing segment 17 is joined to the support base plate 2, and thereby the driven mass body 11 and the detection mass body 12 are held by the support base plate 2 because they are connected to the fixing segment 17. Further, the stationary members 20 are also joined to the support base plate 2. Then, when the cap 3 is joined to the primary base plate 1, the driven mass body 11 and the detection mass body 12 are hermetically contained in a space surrounded by the support base plate 2, the cap 3 and the frame 10. Then, the electrode wiring is formed in each inner peripheral surface of the through-holes 26 of the support base plate 2, and the electrode pad 28 is formed. Through this process, the above gyro sensor is formed.

Second Embodiment

Figure 7A:
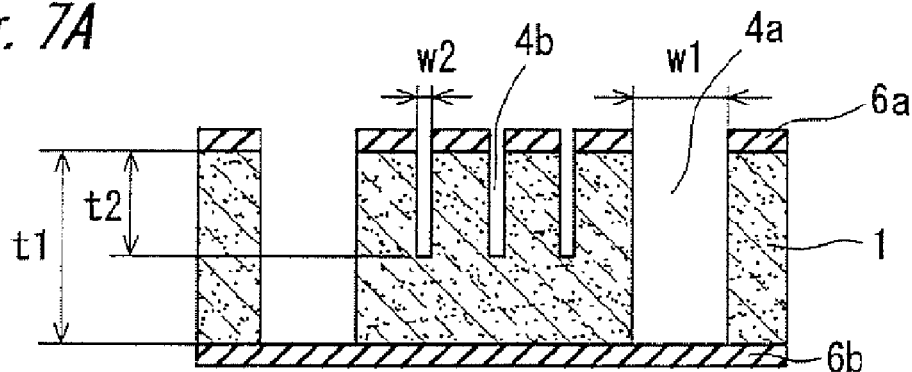
FIGS. 7A to 7D are process diagrams showing a method according to a second embodiment of the present invention.
Figure 7B:
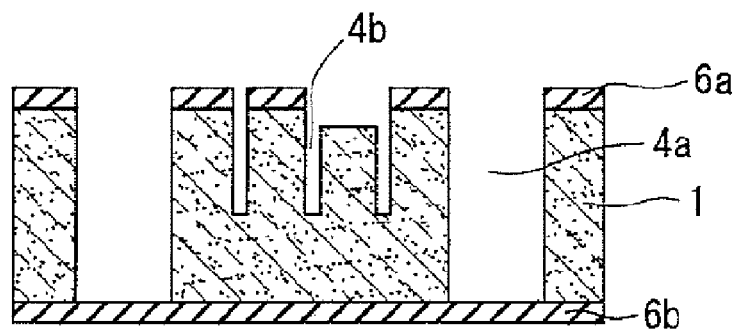

The first embodiment has employed a technique comprising firstly forming a concave portion 7 in the primary base plate 7, and then forming the through-holes 4a, 4b in the primary base plate 7. The second embodiment employs a technique comprising firstly forming through-holes 4a, 4b in a primary base plate 7, and then forming a concave portion 7 in the primary base plate 7. More specifically, as shown in FIG. 7A, in a primary base plate 1 having oxide films 6A, 6B, respectively, formed on opposite surfaces in the thickness direction thereof, openings 8 (see FIGS. 1A to 1C) are formed in one 6A of the oxide films, and the through-holes 4a, 4b having different width dimensions w1, w2 (w1>w2) are formed by a reactive-ion etching process using the oxide film 6A as a mask. The reactive-ion etching process is discontinued at the time when the wide-width through-hole 4a reaches the other oxide film 6b. In this moment, the narrow-width through-hole 4b has not yet penetrated the primary base plate 1, as shown in FIG. 7A, or reaches only a position having a depth dimension t2 equivalent to the midpoint of the thickness dimension of the primary base plate 1. In this stage, according to need, a part of the primary base plate 1 may be removed, as shown in FIG. 7B. For example, a part of the primary base plate 1 is removed to reduce the thickness dimension of the detection mass body 12, because the detection mass body 12 is movable, and not joined to the support base plate 2. During the above process, the components of the primary base plate 1 are integrally connected to each other through the oxide film 6a, and thereby no displacement occurs between the components of the primary base plate 1.

Figure 7C:
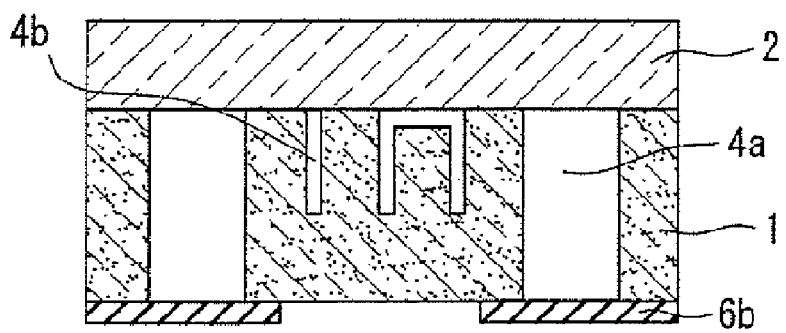
Figure 7D:
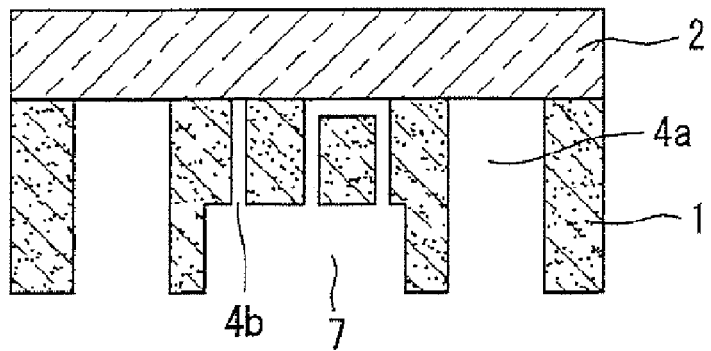

Then, as shown in FIG. 7C, the oxide film 6a is removed, and the primary base plate 1 is joined to the support base plate 2. Subsequently, a mask patter is formed in the oxide film 6b, and a concave portion 7 is formed in a region of the primary base plate 1 corresponding to the narrow-width through-hole 4b, as shown in FIG. 7D. The concave portion 7 is arranged to have a depth allowing its bottom surface to reach the through-hole 4b, so that the through-hole 4b penetrates to the bottom of the concave portion 7. The oxide film 6b is removed in FIG. 7D to join the primary base plate 1 to the cap 3. The remaining structure is the same as that in the first embodiment.

The technique in second embodiment can be employed to separate the movable components from the stationary components, as shown in FIG. 7A, and join these components of the primary base plate 1 to the support base plate 2 in block, as shown in FIG. 7C, before the movable components is separated from each other. In addition, the thickness dimension of a part of the movable component can be appropriately adjusted, as shown in FIG. 7B. Thus, a movable range of the movable component can be arbitrarily set independently of the removal rate of the semiconductor material.

While the aforementioned embodiments has been described as an example where a plurality of through-holes 4a, 4b having two kinds of thickness dimensions are formed, a plurality of through-holes having three or more kinds of thickness dimension may be formed. In this case, the concave portion 7 may be formed corresponding to a through-hole having the narrowest width dimension.

While the present invention has been described in conjunction with specific embodiments thereof, various modifications and alterations will become apparent to those skilled in the art. Therefore, it is intended that the present invention is not limited to the illustrative embodiments herein, but only by the appended claims and their equivalents.

INDUSTRIAL APPLICABILITY

As mentioned above, the semiconductor-device manufacturing method of the present invention is useful, particularly, in forming a micromachine, such as MEMS, and suitable for use as a manufacturing method for an acceleration sensor or an angular velocity sensor.

The invention claimed is:

1. A method of manufacturing a semiconductor device, by use of a perforating process including providing a mask having an opening on a semiconductor substrate, and forming plural types of through-holes different in width dimension in said semiconductor substrate, wherein a removal rate of a semiconductor material in the depth direction of said semiconductor substrate becomes higher as said opening has a wider opening width, said method comprising:

a first step of forming a concave portion in a first surface of a semiconductor substrate, in a first region of said semiconductor substrate corresponding to the opening of said mask having a relatively narrow opening width, to allow said first region to have a thickness dimension less than that of a second, remaining, region of said semiconductor substrate; and a second step of performing said perforating process using said mask provided on a second, opposite, surface of said semiconductor substrate, to form a first through-hole reaching said first surface in said second region of said semiconductor substrate and a second through-hole reaching said concave portion.

2. The method according to claim 1, which includes joining said first surface of said semiconductor substrate to a support substrate after said first step, and then performing said second step.

3. The method according to claim 1, further comprising joining the first surface of the semiconductor substrate to a support substrate after forming the concave portion in the first surface of the semiconductor substrate, and then performing the perforating process.

4. A method of manufacturing a semiconductor device, by use of a perforating process including providing a mask having an opening on a semiconductor substrate, and forming plural types of through-holes different in width dimension in said semiconductor substrate, wherein a removal rate of a semiconductor material in the depth direction of said semiconductor substrate becomes higher as said opening has a wider opening width, said method comprising:

a first step of performing said perforating process using said mask provided on a first surface of a semiconductor substrate until a first through-hole having a relatively wide width dimension reaches a second, opposite, surface of said semiconductor substrate; and a second step of forming a concave portion in said second surface of said semiconductor substrate, in a region of said semiconductor substrate corresponding to the opening of said mask having a relatively narrow opening width, to allow a second through-hole having a relatively narrow width dimension to penetrate to a bottom surface of said concave portion.

5. A method of manufacturing a semiconductor device, by a perforating process including providing a mask having an opening on a semiconductor substrate, and forming plural types of through-holes different in a width dimension in the semiconductor substrate, wherein a removal rate of a semiconductor material in the depth direction of the semiconductor substrate becomes higher as the opening has a wider opening width, the method comprising:

forming a concave portion in a first surface of the semiconductor substrate, in a first region of the semiconductor substrate corresponding to the opening of the mask having a width to allow the first region to have a thickness dimension less than that of a second, remaining region of the semiconductor substrate; and performing the perforating process using the mask provided on a second, opposite, surface of the semiconductor substrate, to form a first through-hole reaching the first surface in the second region of the semiconductor substrate and a second through-hole reaching the concave portion.

6. A method of manufacturing a semiconductor device, by a perforating process including providing a mask having an opening on a semiconductor substrate, and forming plural types of through-holes different in width dimension in the semiconductor substrate, wherein a removal rate of a semiconductor material in the depth direction of the semiconductor substrate becomes higher as the opening has a wider opening width, the method comprising:

performing the perforating process using the mask provided on a first surface of the semiconductor substrate until a first through-hole having a relatively wide width dimension reaches a second, opposite, surface of the semiconductor substrate; and forming a concave portion in the second surface of the semiconductor substrate, in a region of the semiconductor substrate corresponding to the opening of the mask having a relatively narrow opening width, to allow a second through-hole having a relatively narrow width dimension to penetrate to a bottom surface of the concave portion.

* * * * *